United States Patent [19]
Weber

[11] Patent Number: 5,651,464
[45] Date of Patent: Jul. 29, 1997

[54] PACKAGE FOR RECEIVING ARTICLES IN SUCCESSIVE ARRANGEMENT

[75] Inventor: Werner Weber, Windigsteig, Austria

[73] Assignee: EH-Schrack Components AG, Waidhofen/Thaya, Austria

[21] Appl. No.: 388,697

[22] Filed: Feb. 15, 1995

[30] Foreign Application Priority Data

Feb. 15, 1994 [AT] Austria ................................. 294/94
May 26, 1994 [AT] Austria ................................. 1081/94

[51] Int. Cl.$^6$ ................................................. B65D 85/30
[52] U.S. Cl. ................................................. 206/718; 206/721
[58] Field of Search ................................ 206/718, 328, 206/334, 329, 701, 719, 721

[56] References Cited

U.S. PATENT DOCUMENTS

| | | |
|---|---|---|
| 2,949,182 | 8/1960 | Williams ................................. 206/718 |
| 3,385,502 | 5/1968 | Pilger . |
| 4,382,509 | 5/1983 | Gordon ................................. 206/718 |
| 4,487,315 | 12/1984 | Azuma . |
| 4,515,269 | 5/1985 | Hashimoto ................................. 206/718 |
| 4,533,043 | 8/1985 | Swain ................................. 206/718 |
| 4,685,562 | 8/1987 | Swain ................................. 206/718 |
| 4,690,274 | 9/1987 | Lue ................................. 206/718 |
| 4,706,812 | 11/1987 | Spinelli ................................. 206/718 |
| 4,979,615 | 12/1990 | Duncan ................................. 206/718 |
| 5,232,091 | 8/1993 | Hennessy ................................. 206/718 |
| 5,259,508 | 11/1993 | Beckerman . |

*Primary Examiner*—Paul T. Sewell
*Assistant Examiner*—Luan K. Bui
*Attorney, Agent, or Firm*—Henry M. Feiereisen

[57] ABSTRACT

A package for receiving articles in successive arrangement and being of a type having one surface provided with projections, includes an outer enclosure defining an interior; and an insert receiving the articles and being placed in the outer enclosure. The insert has at least one inside surface which is provided with an elevation protruding inwardly from the inside surface into the interior of the enclosure, with the projections of the articles engaging in an area between an inner wall and the projection of the insert.

28 Claims, 6 Drawing Sheets

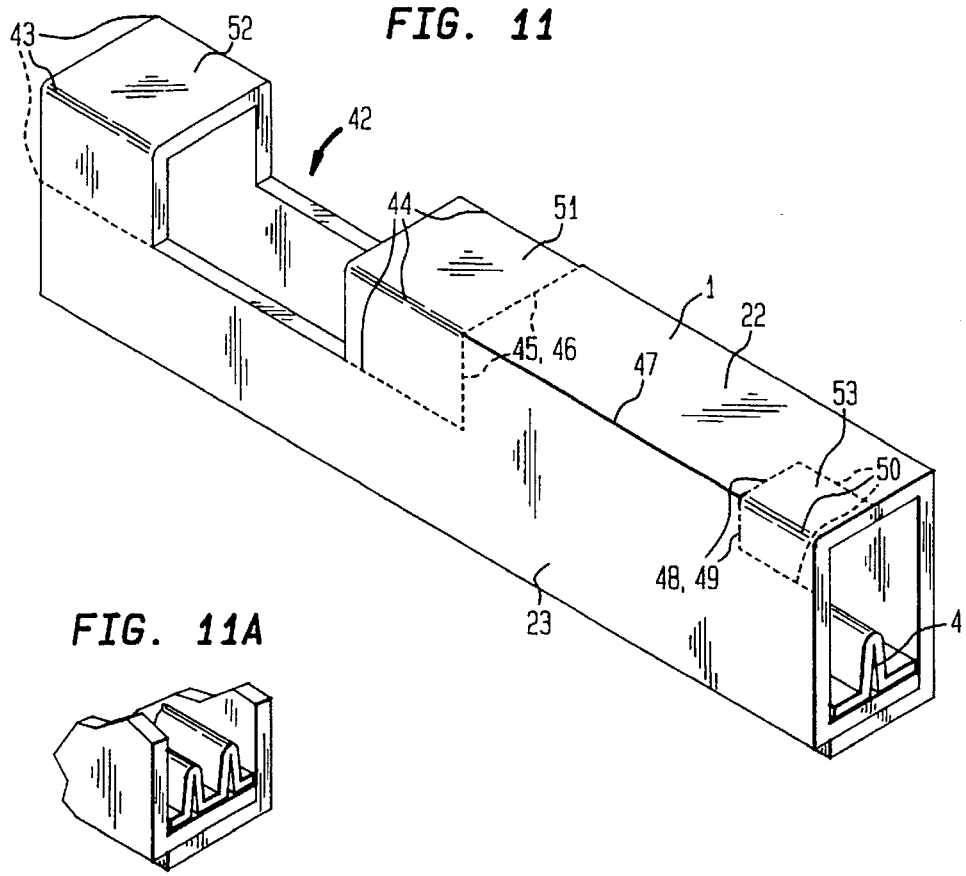
FIG. 11
FIG. 11A
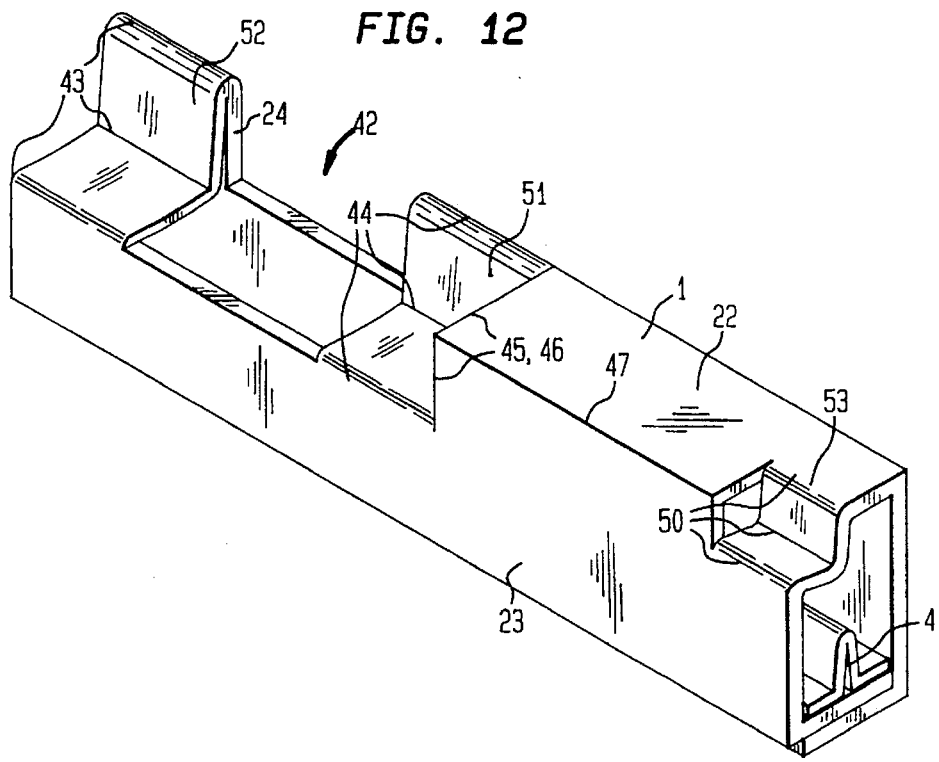
FIG. 12

PACKAGE FOR RECEIVING ARTICLES IN SUCCESSIVE ARRANGEMENT

BACKGROUND OF THE INVENTION

The present invention refers to a package for receiving articles in successive arrangement, and in particular refers to a package for receiving articles having one surface provided with projections or raised parts, such as for example a relay with terminal pins.

In general, smaller articles of this type are placed next to each other and above each other in boxes. This represents a rather time consuming procedure and, moreover, there is always the possibility that the individual articles shift within such a package.

SUMMARY OF THE INVENTION

It is an object of the present invention to provide an improved package of the this type, obviating the afore-stated drawbacks.

In particular, it is an object of the present invention to provide an improved package in which articles can be placed in a very simple manner while being securely held in position and protected from outside forces of impact.

It is still another object of the present invention to provide an improved package which can be made with cost-efficient materials that has properties enhancing the environmental protection and can be easily recycled after being used.

It is yet another object of the present invention to provide an improved package which allows a simple, rapid and controlled loading and removal of articles.

These objects and others which will become apparent hereinafter are attained in accordance with the present invention by forming the package of two parts which are connectable to each other, with one part being an outer envelope and another part being an insert that receives the articles and is placed in the outer enclosure wherein the insert has at least one inside surface provided with an elevation which protrudes inwardly from the inside surface into the interior of the enclosure, with the projections of the articles engaging in an area between an inner wall and the elevation of the insert.

By providing such a two-part package with outer enclosure and insert having an elevation, the individual articles are secured in their position, with the elevation guiding the articles when being placed into the insert and with the inside cross section of the package being suitably dimensioned to receive the articles at slight play. Further, the provision of the elevation ensures that the projections of the articles, such as e.g. the terminal pins of relays, are well protected against damages.

Materials for making the package include easily disposable, foldable materials such as cardboard or the like which need only to be cut and glued. It is certainly conceivable to use different materials for the outer enclosure and the insert. The two-part configuration of the package allows also to first charge the insert with articles and then to place the insert with the articles into the outer enclosure. Moreover, the provision of such an insert has the further advantage that the stability of the package is increased.

Suitably, the surface of the articles formed with the projections beam upon the elevation of the insert. Thus, the projections which generally constitute sensitive components, such as terminal pins of relays, are positioned in an area between the elevation of the insert and a surrounding wall of the package so as to be completely protected from any strains or forces of impacts to which the package may be subjected.

The outer enclosure includes side panels which are preferably shaped to form a tubular body of rectangular cross-section, with side panels preferably overlapping each other to enable a very simple production of the outer enclosure of the package, with foldable materials, such as e.g. cardboard or the like being usable in an advantageous manner.

According to another feature of the present invention, the insert is formed of essentially U-shaped configuration, with the base folded inwardly to form a triangular elevation. In this manner, the projections of the articles are securely and freely positioned relative to the insert. Also in this case, the insert may be of any suitable foldable material, e.g. cardboard, paperboard, composite cardboard or the like, in a very simple and cost-efficient manner.

In accordance with a variation, the insert includes two legs which bear upon the inside wall surfaces of the tubular enclosure and are linked together by a base shaped in form of a W at formation of the elevation. As the legs of the insert extend along the inside wall of the enclosure, the side panels of the package become reinforced to further increase the protection of the articles from outside forces while still allowing a simple manufacture of the insert through folding, bending or the like.

The insert may also be made from an essentially flat piece, with a V-shaped base projecting inwardly to form the elevation. This allows a free and secure positioning of the projections of the articles. Persons skilled in the art will understand that it is certainly possible to provide the insert with two or more such elevations extending next to each other.

Suitable materials for making the insert in a very simple and cost efficient manner include any foldable material, e.g. cardboard, paperboard, composite cardboard or the like. Preferably, the inside surfaces of the insert have sliding properties so that the articles can be simply be pushed in along the insert from one end face of the package, preferably when holding the package at a slight inclination.

According to another feature of the present invention, the package, preferably at least the tubular body of rectangular cross-section, is made of corrugated board, preferably with score lines along the edges of the outer surfaces so that the tubular body can easily be shaped by bending the material along the score lines. This enables a simple production of the package while being easily disposable after use. Other material for making the enclosure include composite board, solid cardboard, preferably with score lines along the edges of the outer surfaces. A package of this kind can be easily shaped into the desired configuration and has a low weight and high stability while being easily disposable. The use of solid cardboard allows making of a package with reproducible and precise dimensions while having walls of low friction coefficient and environmentally acceptable characteristics.

Materials for the insert include corrugated board to allow production in a very simple and cost-efficient manner, composite cardboard to provide a high degree of stability and increased protection of the projections of the articles, or smooth solid cardboard to provide a low friction coefficient and thus an easy sliding ability of the articles along the insert.

According to another feature of the present invention, at least one end region of the tubular enclosure is provided with two cuts which extend substantially perpendicular to an edge defining a junction between two side panels so as to form two flaps which can be inwardly folded along the edge. In this manner, the enclosure can be formed with a stop member in a simple manner by respectively folding the flaps along the score lines to prevent the articles from falling out of the package after being charged. In order to facilitate the bending of the flaps inwardly and to ensure a precise bending of the flaps, the end region has a score line extending parallel to the edge from each of the cuts to the axial end of the enclosure. Upon use of cardboard or like material, the folding of the flaps is easily reversible so that the package can be repeatedly opened and closed without being damaged.

Preferably, the package is provided in at least one end region with indicator means to enable determination of the position of the articles and to ensure that the package is placed in a correct position, e.g. with respect to a filling machine for the articles, so as to allow a charging of the articles in correct position. This is important not only for the filling process but also for emptying especially of asymmetric articles because in this case it must be ensured that the articles reach and exit the plant with their correct side. This becomes particularly important when the package being charged is made of non-transparent material. An exemplified indicator means includes the provision of the package with two aligned openings which form a passage for a light beam emitted from a light barrier. Thus, a fully electronic system is proposed to determine the correct placement of the package in the plant to enable proper charging of articles and to facilitate particularly an automated charging or emptying of the package.

Further indicator means includes the provision of one or more particularly cut corners of the package which are scanned by sensors of the filling machine which clear a placement of the package for the charging process only after responding positively to a determination of the correct position. Thus, an incorrect charging or emptying of the package is eliminated.

A still further possibility to determine the position of the package is the provision of one or more, possibly differently dimensioned folding areas which are arranged preferably asymmetrically so that the position of the package becomes clearly defined.

In accordance with another embodiment of the present invention, the package is provided with a window-type opening at a distance from one end face of the package to allow a simple, rapid and controlled charging and removing of individual articles. Preferably, the window-type opening has a same length as the length of the article so that the article can be withdrawn from or introduced into the package in a direction directly perpendicular to the longitudinal axis without requiring to turn the article. Suitably, the window-type opening is arranged at one end region of the package so that the articles can be introduced or removed from one side.

According to another feature of the present invention, the window-type opening is of rectangular configuration and arranged in one side panel, with the width of the opening being substantially equal to the width of the article so that the articles can be introduced through the window-type opening or withdrawn therefrom by grasping its top or simply by allowing it to fall out through the window-type opening when the package is turned upside down.

Preferably, the window-type opening is of rectangular configuration and extends over at least two side panels of the package to improve accessibility and visibility during removal of the articles.

The tubular body forming the enclosure may include two central cuts adjacent the window-type opening which extend essentially perpendicular to an edge of the tubular body defining a junction between two side panels so as to form flaps which can be inwardly folded along the edge. In this manner, after sliding the last article into the package, the package can be closed by bending the flaps accordingly to prevent the articles from sliding backwards towards the window area. When emptying the package, the flaps are returned to their initial position so that the articles can reach the window area and be removed accordingly. Suitably, the flaps are bent inwardly along score lines which extend from the cuts in parallel relationship to the edge. The provision of such score lines facilitates a bending of the flaps and to retain the flaps in position after being folded.

In accordance with another variation of the present invention, the window-type opening may be formed of rectangular configuration to extend over three side panels of the package. Thus, the articles within the package can be removed with the fingers of a hand in a controlled manner which is in particular advantageous when handling of sensitive articles is concerned. Also the articles can be more easily charged into the package. Preferably, score lines are provided in the area between the end of the package and one end of the window-type opening to form flaps which can be inwardly folded. In this manner, the articles are prevented from escaping through the open end of the package during loading or unloading. The articles can only slide into the package.

The tubular body may have two cuts in an area opposing the window-type opening, with the cuts substantially extending perpendicular to an edge defining a junction between two side panels so as to form flaps which can be inwardly folded along the edge. Thus, the articles are prevented in a simple manner from escaping this end of the package while this end, if necessary, can be opened to allow removal or introduction of articles. Preferably, the tubular body of the enclosure has score lines in an area oriented in parallel relationship to the edge and extending to an end face of the tubular body, to thereby facilitate a bending of this area and to retain the folded position thereof.

BRIEF DESCRIPTION OF THE DRAWING

The above and other objects, features and advantages of the present invention will now be described in more detail with reference to the accompanying drawing in which:

FIG. 1b is a fragmentary, perspective view of the package cut along the line A in FIG. 1a;

FIG. 2 is a sectional view of the package taken along the line A in FIG. 1a;

FIG. 3 is a sectional view of the package taken along the line B in FIG. 1a;

FIG. 11 is a perspective view of still another embodiment of a package according to the present invention;

FIG. 11a is a fragmentary, schematic view of a modified insert for use in a package according to the present invention; and FIG. 12 is a perspective view of still another embodiment of a package according to the present invention.

DETAILED DESCRIPTION OF PREFERRED EMBODIMENTS

Figure 1A:
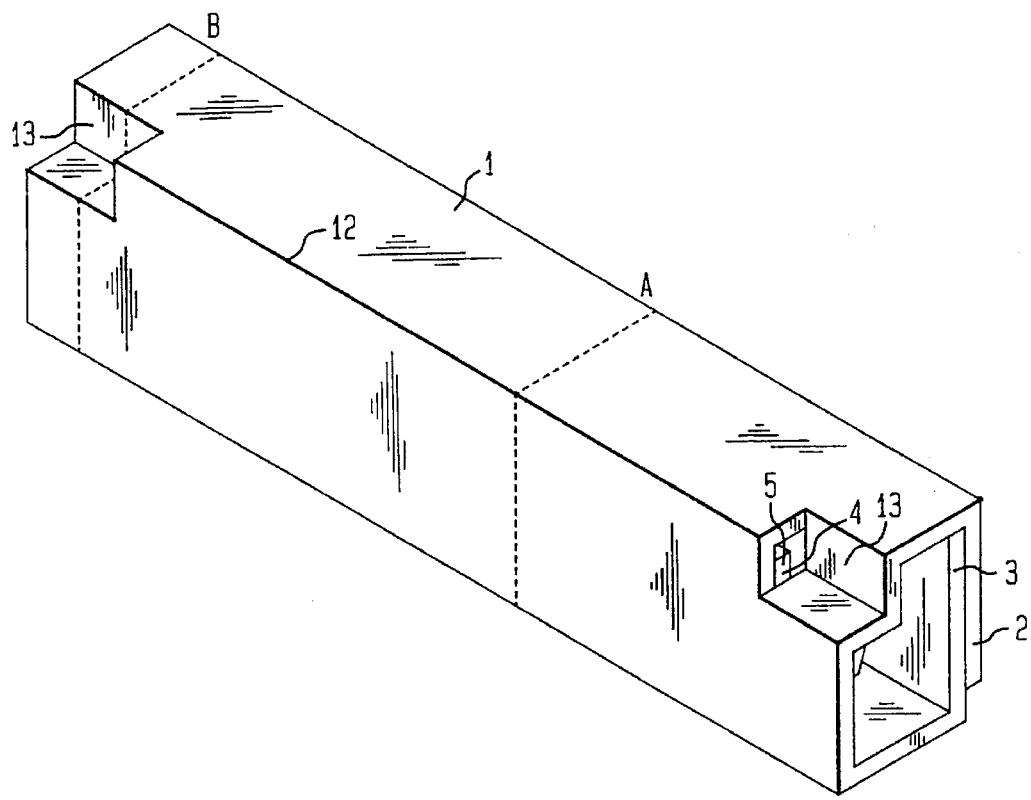
FIG. 1a is a perspective view of one embodiment of a package according to the present invention.

Throughout all the Figures, the same or corresponding elements are always indicated by the same reference numerals.

Turning now to the drawing, and in particular to FIG. 1, there is shown a perspective view of one embodiment of a package according to the present invention, formed of two parts with an outer enclosure 1 and an insert 4 which is placed within the outer enclosure 1. Persons skilled in the art will understand that even though the present example describes a two-part package, it is certainly within the scope of the present invention to provide also multi-part packages without departing from the scope of the present invention.

The outer enclosure 1 and the insert 4 may be joined together e.g. by gluing, stapling, or like connections. The outer enclosure 1 is made of corrugated board which is shaped to form a tubular body with respective side panels, with side panels 2 and 3 overlapping each other. Other materials for making the tubular enclosure 1 include composite board, smooth cardboard, paperboard and like packaging materials. The use of such cardboard-like materials has the advantage of easy disposal compared to the use of e.g. plastic materials. Corrugated board is a cardboard comprised of three layers, with a layer of corrugated paperboard being enclosed between two smooth board layers.

The tubular enclosure 1 is suitably made with folds and/or score lines along the edges being bent. According to one variation of the present invention, both end regions 13 of the tubular enclosure 1 are provided with two cuts which extend perpendicular to an edge 12 defining a junction between two side panels to form respective flaps which can be inwardly folded to provide end regions 13 of stepped configuration. Thus, after placement of the insert 4 with the articles 7 (FIG. 2) into the tubular enclosure 1 and folding the flaps in the end regions 13 inwardly as shown in FIG. 1a, the insert 4 is secured and retained in position between the bent flaps in the end regions 13.

Figure 1B:
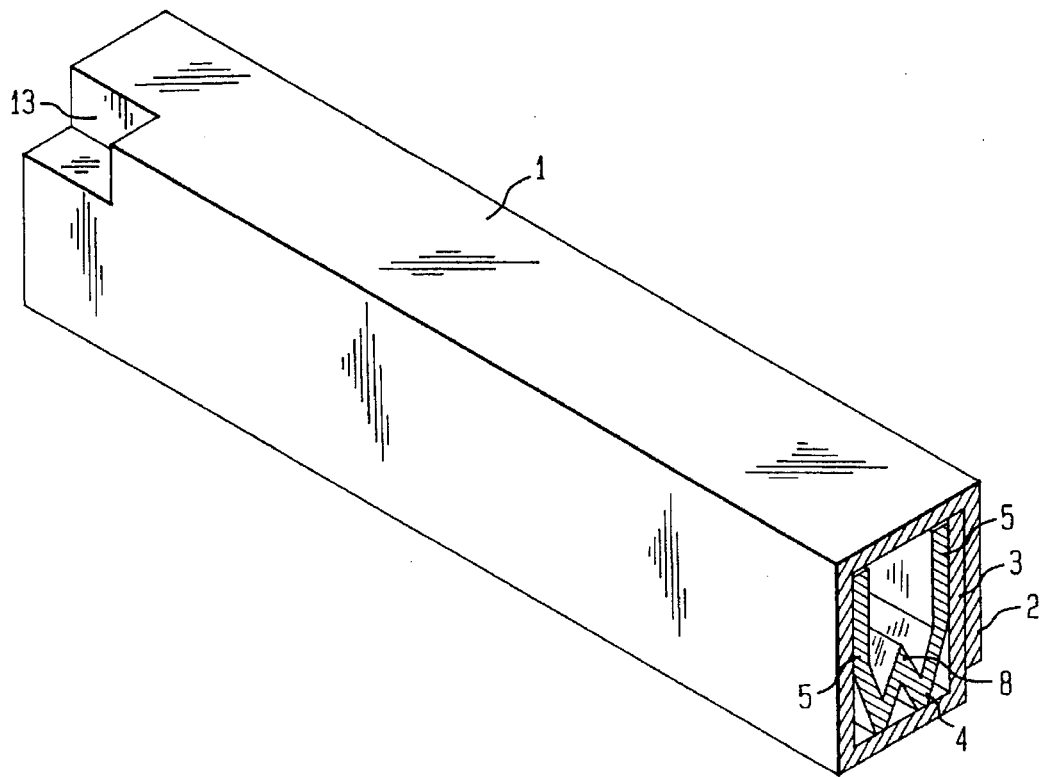

Referring now to FIG. 1b, there is shown a fragmentary, perspective view of the package cut along the line A in FIG. 1a to illustrate the configuration of the insert 4 in more detail. In the nonlimiting example of FIG. 1b, the insert 4 has a base of substantially W-shaped cross section, with two legs 5 extending from the base along the side panels of the enclosure 1. The W-shaped base thus forms a central elevation 8 which extends longitudinally in direction of the enclosure 1. Certainly, it is also possible to form the elevation in discontinuous fashion or in form of knobs. Materials for making the insert 4 include corrugated paperboard, composite cardboard, smooth solid cardboard, paperboard or other packaging materials.

Figure 2:
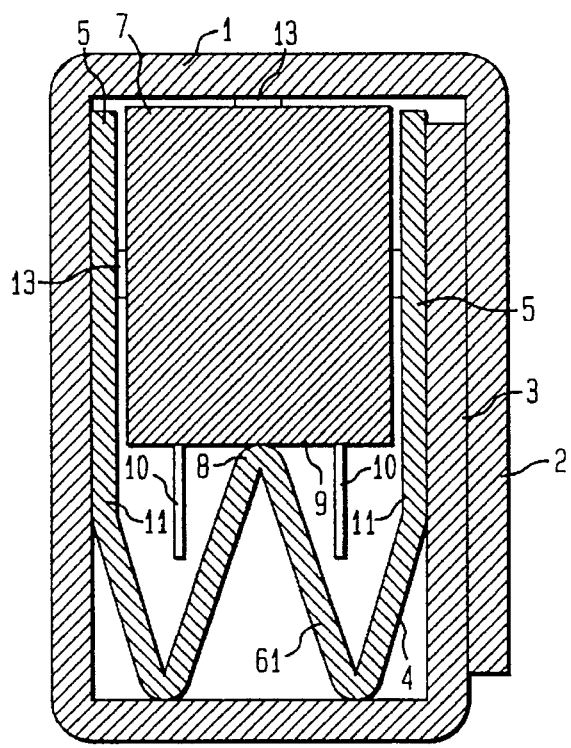

FIG. 2 is a sectional view of the package taken along the line A in FIG. 1a, on an enlarged scale, illustrating in detail the placement of the articles 7 being packed. The overlapping side panels 2, 3 of the enclosure 1 are glued, stapled or joined in any suitable manner to form the tubular configuration for receiving the insert 4 of W-shaped cross section. The articles 7 substantially fill the inside cross section of the package so that only a small play exists between the articles 7 and the neighboring inside walls of the legs 5 of the insert 4. As shown in FIG. 2, the articles 7 e.g. relays with respective terminal pins, rest with their bottom surface 9 upon the elevation 8 of the insert 4 and with their projections 10 which extend downwards from the bottom surface 9 being received in the areas between the inside walls 11 of the legs 5 and the elevation 8 of the base, designated by reference numeral 61. The elevation 8 is formed by suitably folding the base 61 inwardly into the interior of the package. Thus, the projections 10 extend freely without being supported by any surface so as to be better protected from damage through outside forces impacting the package. If desired and less protection is accepted, the projections 10 of the article 7 may also be supported by inner surface areas of the insert in order to improve the guidance of the projections 10 as they are prevented from shifting.

Figure 3:
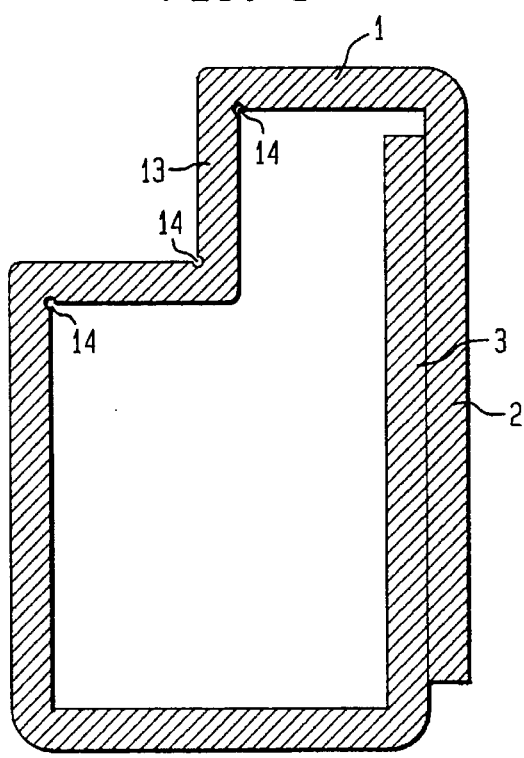

Preferably, the inner surfaces 11 of the insert 4 have sliding properties with low friction coefficient. This could be realized by making the insert 4 from a material which differs from the material of the outer enclosure 1, e.g. of smooth solid cardboard, or by suitable impregnation of the inner surfaces 11, e.g. through waxing or spraying to impart sliding properties to the surfaces 11 and to thereby also permit the use of corrugated paperboard. The sliding capability of the inner surfaces 11 facilitates a filling of the package with articles 7 from one end face. The filling process is further facilitated by holding the outer enclosure 1 with the already pushed-in insert 4 at slight inclination so that individual articles 7 can be very rapidly slid into the package in an orderly manner. The elevation 8 of base 61 substantially protects the projections 10 of the articles 7 from outside forces as may be encountered during transport. After the package is fully charged, and the flaps in the end regions 13 of the tubular enclosure 1 are bent to form respective stepped stops, an escape of the articles 7 out of the package is prevented. FIG. 3, which is a sectional view of the package taken along the line B in FIG. 1a, shows in more detail one inwardly folded end region 13 to form the stop for the articles 7. In order to accurately define the inwardly bent end region 13 during production, score lines 14 are provided along the edge 12 which extend parallel to the edge 12 from each cut to the respective axial end of the outer enclosure 1. The formed flaps in the end regions 13 can then easily be bent inwardly along the score lines 14.

Figure 4:
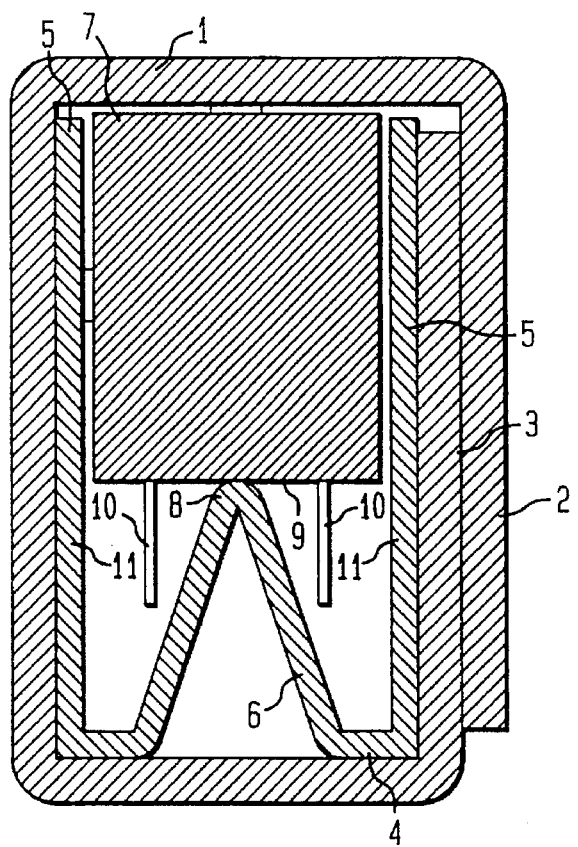
FIG. 4 is a sectional view of another embodiment of a package according to the present invention.

FIG. 4 shows a sectional view of a variation of the insert 4 which is of substantially U shaped configuration with a base 6 formed to include an elevation 8 of triangular shape pointing into the interior of the package. In contrast to the embodiment of FIG. 2, the legs 5 extend substantially along the entire inside wall surfaces of the tubular enclosure 1 so that the side panels of the package become reinforced to impart the package with a more stable configuration. Articles 7 such as electromagnetic relays or other sensitive electronic pieces e.g. integrated circuit boards or the like are placed in the insert 4 in a same manner as described with reference to FIG. 2, with their projections 10, e.g. terminal pins, extended freely in the space between the projection 8 and the legs 5 of the insert 4 to thereby protect the projections 10 from any outside stress.

Persons skilled in the art will understand that any type of article with sensitive projections which must be protected can be packed in a package according to the present invention.

Figure 5:
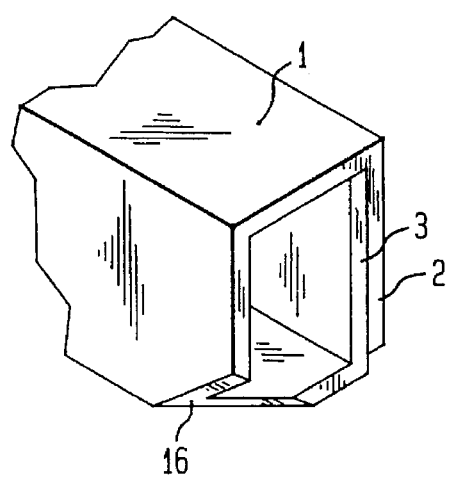
FIG. 5 is a fragmentary perspective view of still another embodiment of a package according to the present invention.

FIG. 5 is a schematic view of a package according to the present invention, provided with an indicator means for allowing a determination as to whether the package is transported or placed properly for subsequent processing e.g. in a filling machine for charging with articles 7. The indicator means is formed by slantingly cutting one corner 16 at one end region of the tubular enclosure. The filling machine is equipped with a sensor (not shown) which scans the incoming package for presence of the cut corner 16 and triggers a suitable signal when recognizing the cut corner to indicate a correct orientation of the package so that the articles can be properly charged into the package or emptied therefrom. Certainly, the enclosure 1 may be provided with several cut corners or other similar recesses performing a same function.

Other indicator means for enabling a determination of the position of the package may include two aligned openings in the enclosure which allow passage of a light beam emitted from a light barrier.

Figure 6:
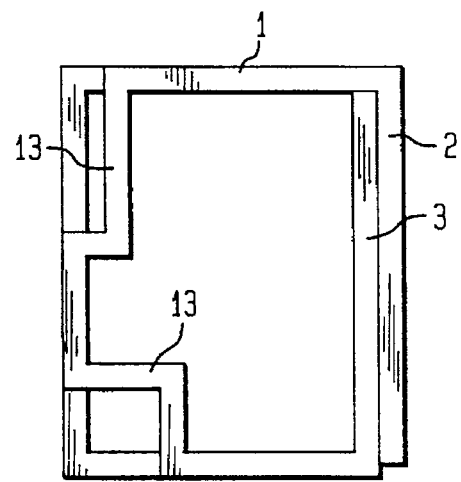
FIG. 6 is a front plan view of yet another embodiment of a package according to the present invention.

FIG. 6 shows another variation of indicator means in form of differently dimensioned flaps at the end regions 13 of the tubular enclosure 1 with overlapping side panels 2, 3. In this manner an incorrect placement of the package in the filling plant is prevented since the other (not shown) end region has e.g. only one flap 13 so that the difference between both end regions is recognizable. In addition, after bending the flaps 13 inwardly, an escape of the article 7 is prevented. Certainly, several such flaps can be provided either on different sides or on the same side.

Figure 7:
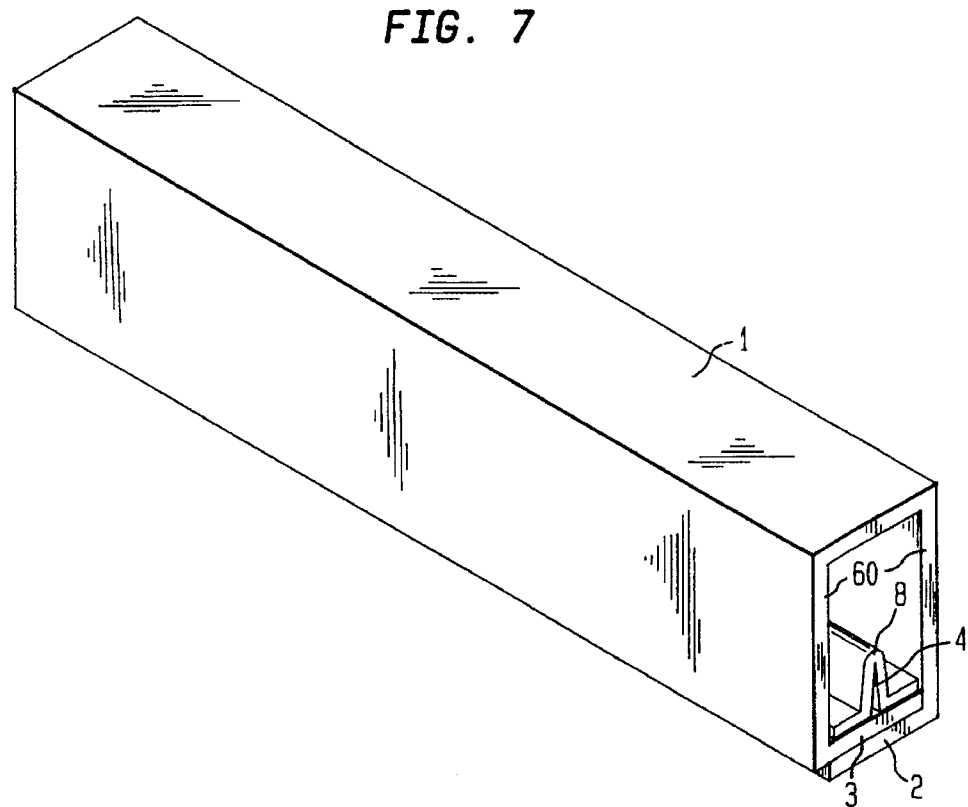
FIG. 7 is a perspective view of still another embodiment of a package according to the present invention.

FIG. 7 is a perspective view of still another embodiment of a package according to the present invention which is also of two-part configuration comprised of outer enclosure 1 and insert 4. The outer enclosure 1 is of tubular configuration and made of corrugated paperboard, composite cardboard, smooth cardboard, paperboard or other packaging materials, with two side panels 2, 3 overlapping each other and suitably glued, stapled or joined in any suitable manner. The insert 4 is made from an essentially flat part which extends between the inside wall surfaces 60 of the outer enclosure 1, with the elevation 8 formed by folding a central section 62 in a V-shaped manner. The flat part for making the insert 4 may be a strip e.g. of smooth cardboard which is simply folded inwardly in the central section 62 and joined with the outer enclosure 1 through gluing or similar connection. In case the package is being filled with articles 7 having several rows of projections 10, the insert is accordingly formed i.e. with two or more V-shaped sections neighboring each other to respectively receive the projections 10 e.g. terminal pins of relays. A configuration with two neighboring V-shaped sections 62 is shown by way of example in the schematic view of FIG. 11.

Figure 8:
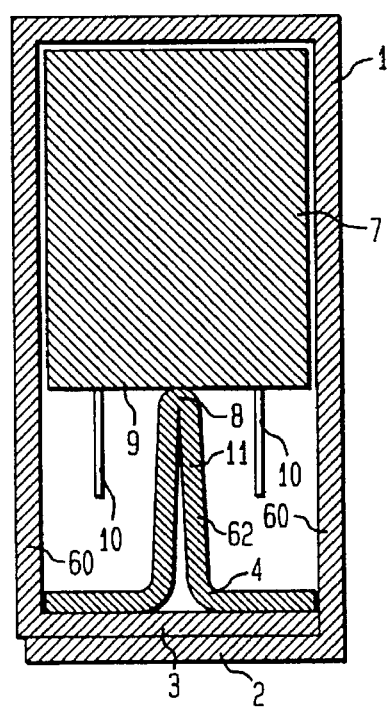
FIG. 8 is a sectional view of the package of FIG. 7.

As shown in FIG. 8, which is a sectional view of the package according to FIG. 7, the article 7 bears with its bottom surface 9 upon the elevation 8, with the projections 10 being received in the space between the elevation 8 and the opposing inner wall surfaces 60 of the outer enclosure 1. The article 7 substantially fills the inside cross section of the package so that only a small play exists. The projections 10 are thus freely contained in the package and protected from any outside impacts. If desired, the package may be configured also in such a manner that the projections 10 are supported by the inner wall surfaces to improve the guidance of the articles. Suitably, the inner surfaces 11 of the insert 4 are imparted with sliding properties with small friction coefficient through waxing or spraying the surface 11 with sliding enhancing material as described above.

Figure 9:
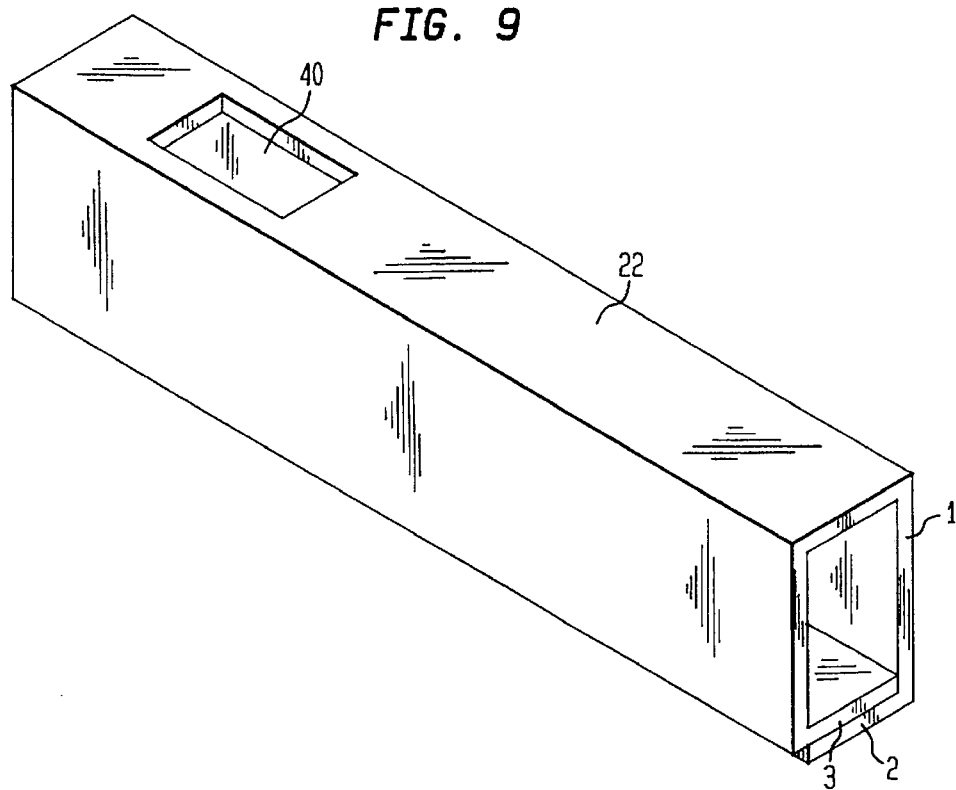
FIG. 9 is a perspective view of still another embodiment of a package according to the present invention.

Turning now to FIG. 9, there is shown a perspective view of still another embodiment of a package according to the present invention, including an outer enclosure 1 provided with a window-type opening 40 on the top side panel 22 for charging or withdrawing articles from the package. The opening 40 is arranged in an end area of the package so that the articles can be introduced or removed from one side. Preferably, the opening 40 is of a substantially same length as the length of the article to allow a charging of the articles directly without requiring to turn the articles. The opening 40 is of rectangular configuration, with the width of the opening 40 also essentially corresponding to the width of the article. Persons skilled in the art will understand that the opening 40 may have any suitable configuration which facilitates the charging or removing operation of articles. In the position shown in FIG. 9, the articles are introduced into the package 1 from above. When being removed, the articles are grasped at the top and withdrawn through the window 40. Removal of articles may also be attained by positioning the package upside down so that the window is positioned now at the bottom so that the individual articles can simply fall out of the package.

Figure 10:
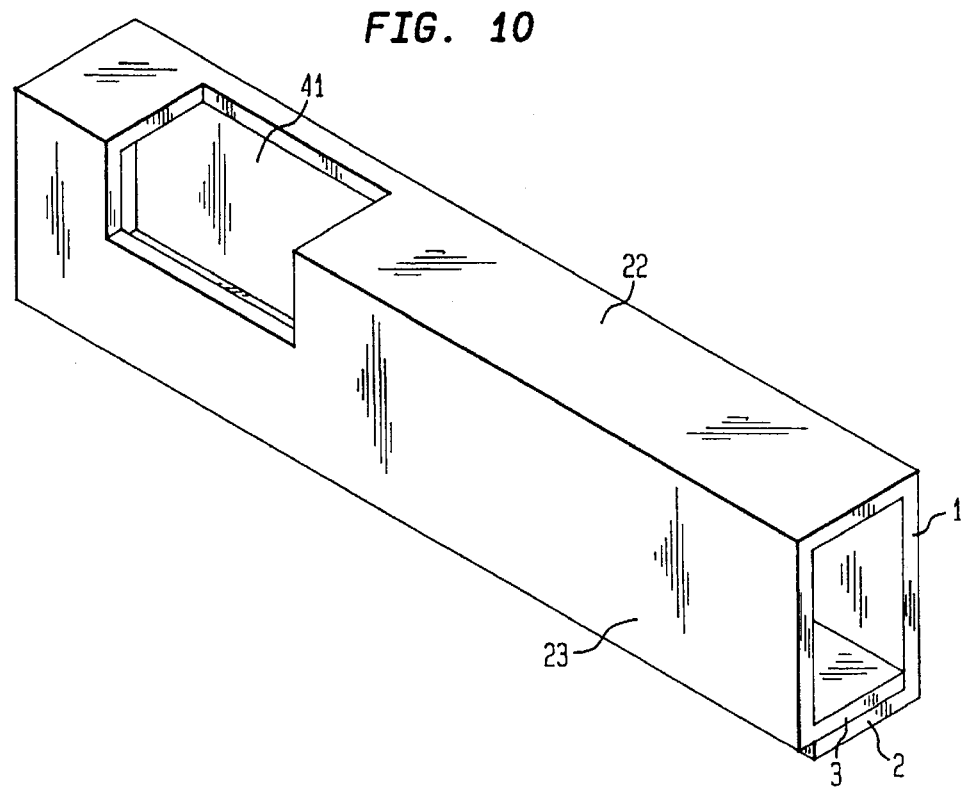
FIG. 10 is a perspective view of still another embodiment of a package according to the present invention.

FIG. 10 shows a variation in which the package is provided with a window-type opening 41 which extends over two side panels 42 and 43 of the package to provide a better accessibility to the articles.

Turning now to FIG. 11, there is shown a perspective view of still another embodiment of a package according to the present invention, in which the outer enclosure 1 includes an insert 4 according to the embodiment shown in FIG. 7. The enclosure 1 is provided with a rectangular, window-type opening 42 which extends over three side panels 22, 23, 24 of the enclosure 1. The articles are thus accessible from the top and both sides to thereby facilitate a removal or charging of the articles with the fingers of one hand. The article rests upon the insert 4 in a manner shown in FIG. 8 in which the projections 10 extend between the inside walls 60 of the enclosure 1 and the inside walls 11 of the base 62 of the insert 4. Extending in an area 52 between the axial end of the package and one end of the window-type opening 42 are score lines 43 to allow a bending of the formed flaps inwardly as shown in FIG. 12. Thus, once the articles are placed within the package, an escape through an open end of the package is prevented. A further area 51 is provided adjacent the window-type opening 42 in opposition to the area 52 and defined by two cuts 45, 46 which essentially extend perpendicular to an edge 47 forming a junction between the side panels 22, 23. The area 51 between the cuts 45, 46 can be inwardly bent and folded along the edge 47. Suitably, the area 51 is provided with score lines 44 extending from the end points of the cuts 45, 46 in parallel relationship to the edge 47. Thus, after sliding the last article during filling operation into the package, the latter can be closed from this side by inwardly bending the fold in area 51 to prevent articles from escaping through the window type opening 42. When unloading the package, the flaps of area 51 are returned to their original position to enable the removal of the articles through the opening 42.

As further shown in FIGS. 11 and 12, the outer enclosure 1 includes an end region 53 in opposition to the window-type opening 42, provided with two cuts 48 49 which extend substantially perpendicular to the edge 47 to form respective flaps which can be inwardly bent between the cuts 48, 49 along the edge 47, as best seen in FIG. 12. Thus, the articles are also prevented from escaping from this end of the package. Score lines 50 are provided to facilitate a folding of the flaps in the end region 53, with the score lines 50 extending from the end points of the cuts 48, 49 in parallel relationship to the edge 47.

While the invention has been illustrated and described as embodied in a package for receiving articles in successive arrangement, it is not intended to be limited to the details shown since various modifications and structural changes may be made without departing in any way from the spirit of the present invention.

What is claimed as new and desired to be protected by Letters Patent is set forth in the appended claims.

I claim:

1. A package for receiving articles in successive arrangement and being of a type having one surface provided with projections, said package comprising:

an outer enclosure having side panels to define a tubular body with an interior and having an end region with two cuts which extend substantially perpendicular to an edge defining a junction between two side panels so as to form two flaps which are inwardly foldable along said edge, with said end region having a score line extending parallel to said edge from each said cut to an axial end of said enclosure for inwardly folding said flaps at said score line; and a separate insert receiving the articles and being placed in said outer enclosure, said insert having at least one inside surface provided with an elevation disposed substantially centrally in said insert end exhibiting a substantially triangular configuration, said elevation protruding inwardly from said inside surface into the interior of the enclosure and having converging side faces to exhibit a substantially pointed configuration for support of the articles, with the projections of the articles being received in an area on either side of said elevation of said insert.

2. The package defined in claim 1 wherein said elevation extends in longitudinal direction of said insert.

3. The package defined in claim 1 wherein said elevation of said insert supports the article upon its surface provided with the projections.

4. The package defined in claim 1 wherein said tubular body is of rectangular cross section.

5. The package defined in claim 4 wherein said tubular body has overlapping side panels.

6. The package defined in claim 4 wherein said insert is formed of essentially U-shaped configuration, with a base having a section projecting inwardly from said base to form said elevation with triangular shape.

7. The package defined in claim 4 wherein said insert has two legs bearing upon the side panels of said tubular body and connected to each other by a W-shaped base which forms said elevation.

8. The package defined in claim 4 wherein said insert is made from an essentially flat part which includes a V-shaped base projecting inwardly to form said elevation.

9. The package defined in claim 1 wherein said insert has sliding-promoting inner surfaces.

10. The package defined in claim 3 wherein at least said enclosure is made of a material selected from the group consisting of corrugated cardboard, composite cardboard and smooth solid cardboard.

11. The package defined in claim 10 wherein said enclosure has score lines along edges to be bent to form said side panels of said tubular body.

12. The package defined in claim 1 wherein said insert is made of a material selected from the group consisting of corrugated cardboard, composite cardboard and smooth solid cardboard.

13. The package defined in claim 1, further comprising indicator means provided in at least one end region of the package for determination of a position of the articles.

14. The package defined in claim 13 wherein said indicator means is formed by two opposing openings allowing a passage of a light beam emitted from a light barrier.

15. The package defined in claim 13 wherein said indicator means is formed by at least one cut corner.

16. The package defined in claim 13 wherein said indicator means includes at least one folding area.

17. The package defined in claim 16 wherein said indicator means includes several folding areas of varying dimensions.

18. The package defined in claim 17 wherein said folding areas are arranged asymmetrical.

19. A package for receiving articles of a type having one surface provided with projections, said package comprising:

an outer enclosure defining an interior and having side panels forming a tubular body, said tubular body having a window-type opening at a distance from one end face for allowing loading articles into and removing articles from the interior and including two cuts adjacent said window-type opening which extend essentially perpendicular to an edge of said tubular body defining a junction between two side panels so as to form flaps which are inwardly foldable along said edge; and a separate insert receiving the articles and being placed in said outer enclosure, said insert having at least one inside surface provided with an elevation disposed substantially centrally in said insert and exhibiting a substantially triangular configuration, said elevation protruding inwardly from said inside surface into the interior of the enclosure and having converging side faces to exhibit a substantially pointed configuration for support of the articles, with the projections of the articles being received in an area on either side of said elevation of said insert.

20. The package defined in claim 19 wherein said window-type opening has a same length as a length of the article.

21. The package defined in claim 19 wherein said window-type opening is arranged on one end region of the package.

22. The package defined in claim 19 wherein said window-type opening is of rectangular configuration and arranged in one side panel, with said opening having a same width as a width of article.

23. The package defined in claim 19 wherein said window-type opening is of rectangular configuration and extends over at least two side panels of the package.

24. The package defined in claim 19 wherein said flaps are bent inwardly along score lines extending from said cuts in parallel relationship to said edge.

25. The package defined in claim 19 wherein said window-type opening is of rectangular configuration and extends over three side panels of the package.

26. The package defined in claim 19 wherein said tubular has score lines in an area between an axial end of said enclosure and an end of said window-type opening to form flaps which are inwardly foldable.

27. The package defined in claim 19 wherein said tubular body has two cuts in an area distant to said window-type opening at an opposing end face, said cuts substantially extending perpendicular to an edge defining a junction between two side panels so as to form flaps which are inwardly foldable along said edge.

28. The package defined in claim 19 wherein said tubular body has score lines in an area oriented in parallel relationship to said edge and extending to an end face of said enclosure.

* * * * *